United States Patent [19]

Nakano et al.

[11] Patent Number: 4,857,001
[45] Date of Patent: Aug. 15, 1989

[54] ELECTRICAL CONNECTORS FOR LEADLESS CIRCUIT BOARDS

[75] Inventors: Kenichi Nakano; Yoshihiro Umezawa; Tetsuro Tokaichi; Yoshiaki Ichimura; Natsuki Kawabe, all of Tokyo, Japan

[73] Assignees: Nippon Telegraph & Telephone Public Corporation; Nippon Electric Co., Ltd.; Japan Aviation Electronics Industry Limited, all of Japan

[21] Appl. No.: 183,271

[22] Filed: Apr. 6, 1988

Related U.S. Application Data

[63] Continuation of Ser. No. 9,611, Jan. 21, 1987, abandoned, which is a continuation of Ser. No. 873,473, Jun. 9, 1986, abandoned, which is a continuation of Ser. No. 746,454, Jun. 19, 1985, abandoned, which is a continuation of Ser. No. 611,400, May 18, 1984, abandoned, which is a continuation of Ser. No. 321,757, Nov. 16, 1981, abandoned.

[30] Foreign Application Priority Data

Nov. 14, 1980 [JP] Japan .............................. 55-159410

[51] Int. Cl.⁴ .......................................... H01R 13/42
[52] U.S. Cl. ...................................... 439/68; 439/78; 439/733
[58] Field of Search .................. 439/65, 68, 69, 71, 439/73, 74, 330, 331, 525, 526, 733, 744–749, 751, 869, 872, 873

[56] References Cited

U.S. PATENT DOCUMENTS

| | | | |
|---|---|---|---|
| 3,377,514 | 4/1968 | Ruehlemann et al. | 339/17 CF |
| 3,568,134 | 3/1971 | Anhalt et al. | 339/75 MP |
| 3,718,895 | 2/1973 | Reynolds et al. | 339/17 CF |
| 3,951,491 | 4/1976 | Mysiak | 339/17 CF |
| 3,960,423 | 6/1976 | Weisenburger | 339/17 CF |
| 3,964,816 | 6/1976 | Narozny | 339/221 M |
| 3,999,827 | 12/1976 | Hutchison et al. | 339/75 MP |
| 4,063,791 | 12/1977 | Cutchaw | 339/17 CF |
| 4,204,722 | 5/1980 | Yasui et al. | 339/75 MP |
| 4,283,105 | 8/1981 | Ferrill et al. | 339/217 S |
| 4,334,727 | 6/1982 | Scheingold et al. | 339/17 CF |
| 4,340,266 | 7/1982 | Grovender | 339/17 CF |

FOREIGN PATENT DOCUMENTS

| | | | |
|---|---|---|---|
| 3014875 | 10/1981 | Fed. Rep. of Germany | 339/221 R |
| 0153295 | 12/1979 | Japan | 339/17 CF |

Primary Examiner—Gary F. Paumen
Attorney, Agent, or Firm—Laff, Whitesel, Conte & Saret

[57] ABSTRACT

An electrical connector having contact elements, for mounting a leadless circuit board to a mother board. Each contact element is provided with a projection laterally projecting therefrom which engages with the lower opening edge of a through-hole of the mother board to maintain the connector in contact with the surface of the mother board. Connector apertures are arranged to a zigzag pattern to form first and second rows, and the contact elements are inserted in the apertures of the first and second rows with reversed orientation.

10 Claims, 7 Drawing Sheets

ELECTRICAL CONNECTORS FOR LEADLESS CIRCUIT BOARDS

This application is a continuation of application Ser. No. 009,611, filed 1/21/87, which was a continuation of Ser. No. 873,473 filed 6/9/86, which was a continuation of Ser. No. 746,454, filed 6/19/85, which was a continuation of Ser. No. 611,400, filed 5/18/84, which was a continuation of Ser. No. 321,757 filed 11/16/81, all of the aforementioned being now abandoned.

BACKGROUND OF THE INVENTION

This invention relates to electrical connectors, and in particular, to contacts of connectors for leadless circuit boards such as leadless integrated circuit packages, leadless large-scaled circuit packages, and leadless printed circuit boards.

In order to removably mount the leadless circuit boards (which will be referred to as "daughter board") employing terminal pads in place of leads onto another circuit board (which will be referred to as "mother board"), connectors have been used in the prior art as disclosed in U.S. patent Nos. 3,904,262, 4,063,791 and 4,204,722. Generally speaking, such a connector includes a housing of insulator material for receiving the daughter board therein, a plurality of contact elements mounted in the housing to engage with terminal pads of the received daughter board and to connect with conductor elements of the mother board on which the connector is mounted, and clamping means for clamping and depressing the daughter board to the mother board to establish engagement between the terminal pads of daughter board and the contact elements and having hook members to engage with openings of connector housing to keep the daughter board in a depressed condition.

In an arrangement for fixedly mounting the connector on the mother board, each contact element is formed with a terminal pin portion downwardly extending from the housing, and the terminal pin portion is inserted into a corresponding aperture or through-hole formed in the corresponding conductor element of the mother board and is soldered thereto, so that the connector is fixedly mounted on the mother board as well as electrical connection of the contact element with the conductor element. In this arrangement, since no means for joining the housing per se to the mother board is required, volume of the connector housing and area required to mount the connector preferably reduced. However, in order to avoid such a bad mounting condition of the connector where the housing is maintained to be raised and spaced apart from the surface of the mother board, the connector is required to be pressed onto the surface of the mother board during soldering process. This means that the soldering process is performed manually not automatically.

Since the connector is fixedly mounted on the mother board by the contact elements, contact elements are required to be firmly joined to the hoursing. However, assembling and intended disassembling of the contact elements to the housing are required to be readily performed, for production and servicing.

Furthermore, in order to realize reliable engagement of contact elements with terminal pads of the daughter board received in the connector, it is desired that sufficient and uniform contact pressure is generated for reliable engagement between the contact elements and the terminal pads without any engagement of the daugther board with a portion other than the contact region of the contact element.

SUMMARY OF THE INVENTION

Accordingly, it is an object of this invention to provide a connector for mounting a leadless circuit board, or a daughter board, onto another circuit board, or a mother board, wherein the connector can be readily mounted on the mother board by contact elements thereof soldered to the mother board in a condition that the bottom surface of the connector housing is in contact with the surface of the mother board.

It is another object of this invention to provide a connector for mounting a leadless daughter board onto a mother board wherein contact elements are readily assembled into, and disassembled from, the connector housing but are firmly joined to the connector housing without non-intended falling off of the contact element.

It is still another object of this invention to provide a connector for mounting a leadless daughter board onto a mother board wherein reliable and uniform engagement is made between all of terminal pads of the daugher board and all of the contact elements of the connector, but the other portion other than the contact region of the contact element does not engage with the daughter board even after long use.

It is a further object of this invention to realize the above objects with a simple arrangement and a low cost.

According to this invention, an electrical connector for mounting a first electric circuit board having terminal pads onto a second electric circuit board with electrically connecting the pads with conductor elements of the second electric circuit board includes an insulator housing having an opening at a central portion thereof for mounting the first electric circuit board thereinto, and a plurality of contact elements mounted in the insulator housing. Each contact element has a spring contact portion extending from the housing into the opening for engagement with the terminal pad and a terminal pin portion extending from the housing to be inserted into a through-hole formed at the conductor element of the second circuit board for electrically connecting with the conductor element. The terminal pin portion has a lateral projection protruding from a side surface thereof at a position spaced apart from the bottom surface of the housing by a distance nearly equal to, and slightly larger than, the thickness of the second circuit board. The connector mounted on the second circuit board may therefore be reliably maintained in contact with the surface of the second circuit board by engagement of the lateral projection of each terminal pin portion with the lower opening edge of each through-hole of the second circuit board.

The contact element is formed of a sheet of metal plate to have a central portion between the spring contact portion and the terminal pin portion. The spring contact portion extends upwardly from the upper end of the central portion through a first portion bent by a first angle, for example, 90° and a second portion bent by a second angle less than the first angle. The spring contact portion is reduced in its width along the extension to form a contact region at its top end of the reduced width. The central portion is provided with finger means the top of which is raised from the surface of the central portion, a protrusion press-formed on the surface thereof, and a pair of fin means projecting laterally from upper opposite ends thereof. The lateral projection projects from the side surface of the terminal pin portion in the width direction of the central portion.

The insulator housing is formed with a plurality of apertures in which the central portions of the contact elements are secured. The aperture is in a rectangular form which has a width slightly smaller than the total dimension of the thickness of the metal plate of the contact element and the height of the protrusion and a length slightly larger than the width of the central portion but smaller than the span between the opposite ends of the pair of fin means. The aperture is partially enlarged in its width direction therein to form a chamber in which the finger means is received to prevent the contact element from falling off upwardly from the insulator housing. The fin means of the contact element engages with the opening edge of the aperture to prevent the contact element from falling off downwardly from the insulator housing.

The apertures are arranged in two rows along the edge of the opening of the insulator housing. A first group of the contact elements are secured in the apertures of one row with an orientation and a second group of the contact elements are secured in the aperatures of the other row with a reversed orintation, so that the lateral projections of the first group of contact elements project in an opposite direction to those of the second group of contact elements.

The apertures in one row are offset from the apertures in the other row in the direction of the rows and the terminal pin portion is offset (i.e. not coaxial) from the contact region in the width direction of the central portion of the contact element so that the contact regions of the first and second groups of the contact elements are disposed in a zigzag pattern but the terminal pin portions are disposed in a matrix. The through-holes of the second electric circuit board are disposed in a matrix.

The height h of each lateral projection is selected as:

$$D-W > h > (D-W)/2 - \Delta,$$

where D is a diameter of the through-hole, W is a width of the terminal pin portion, and $\Delta$ is an offset distance between the central axis of the through-hole and the central axis of the terminal pin portion (i.e. the hole and the pin are not coaxial).

Further objects, features and other aspects of this invention will be understood from the following detailed description of preferred embodiments of this invention with reference to the accompanying drawings.

DETAILED DESCRIPTION OF PREFERRED EMBODIMENTS

Figure 1:
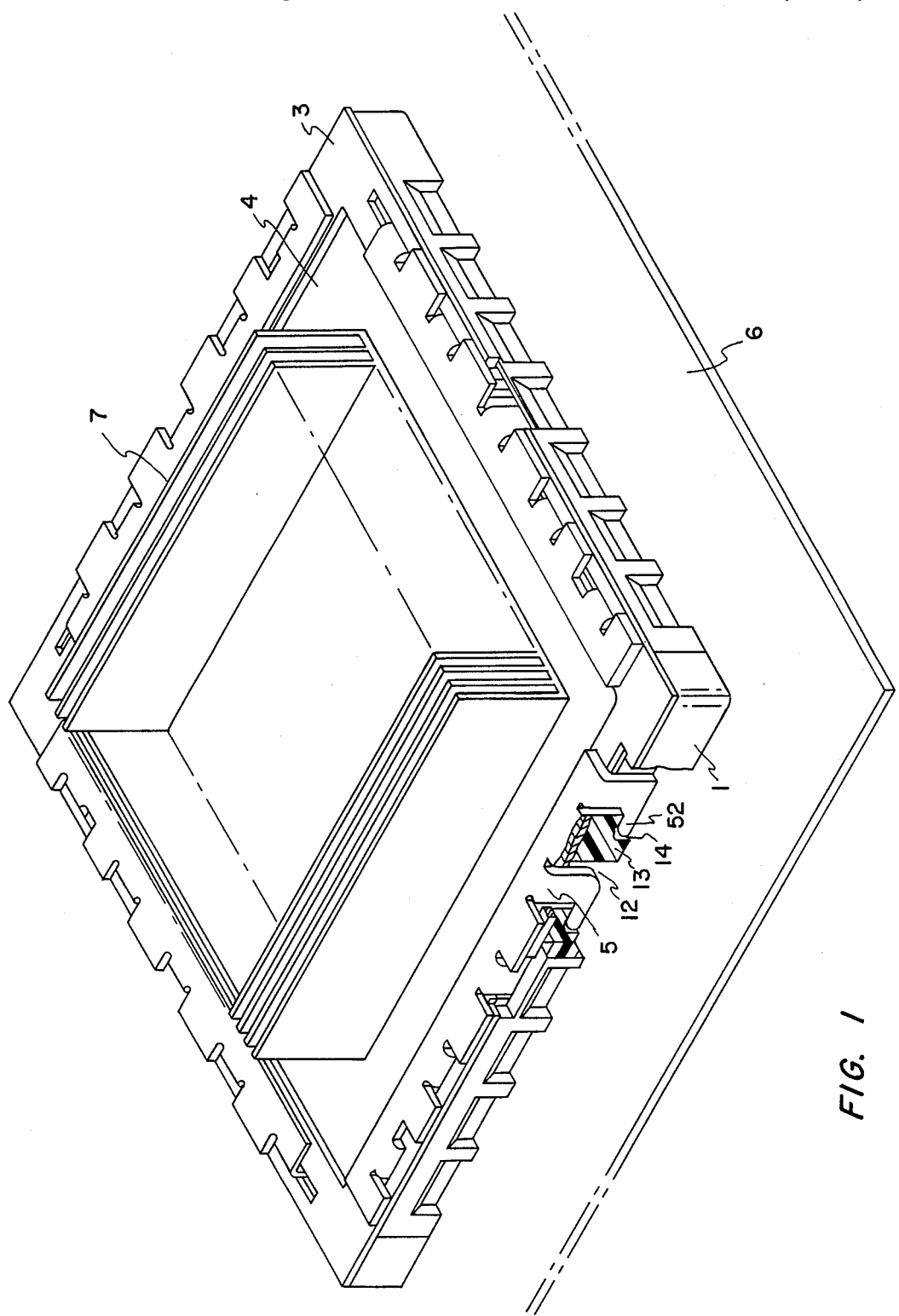
FIG. 1 is a perspective view of a connector of an embodiment according to this invention, with a protion exploded.
Figure 2:
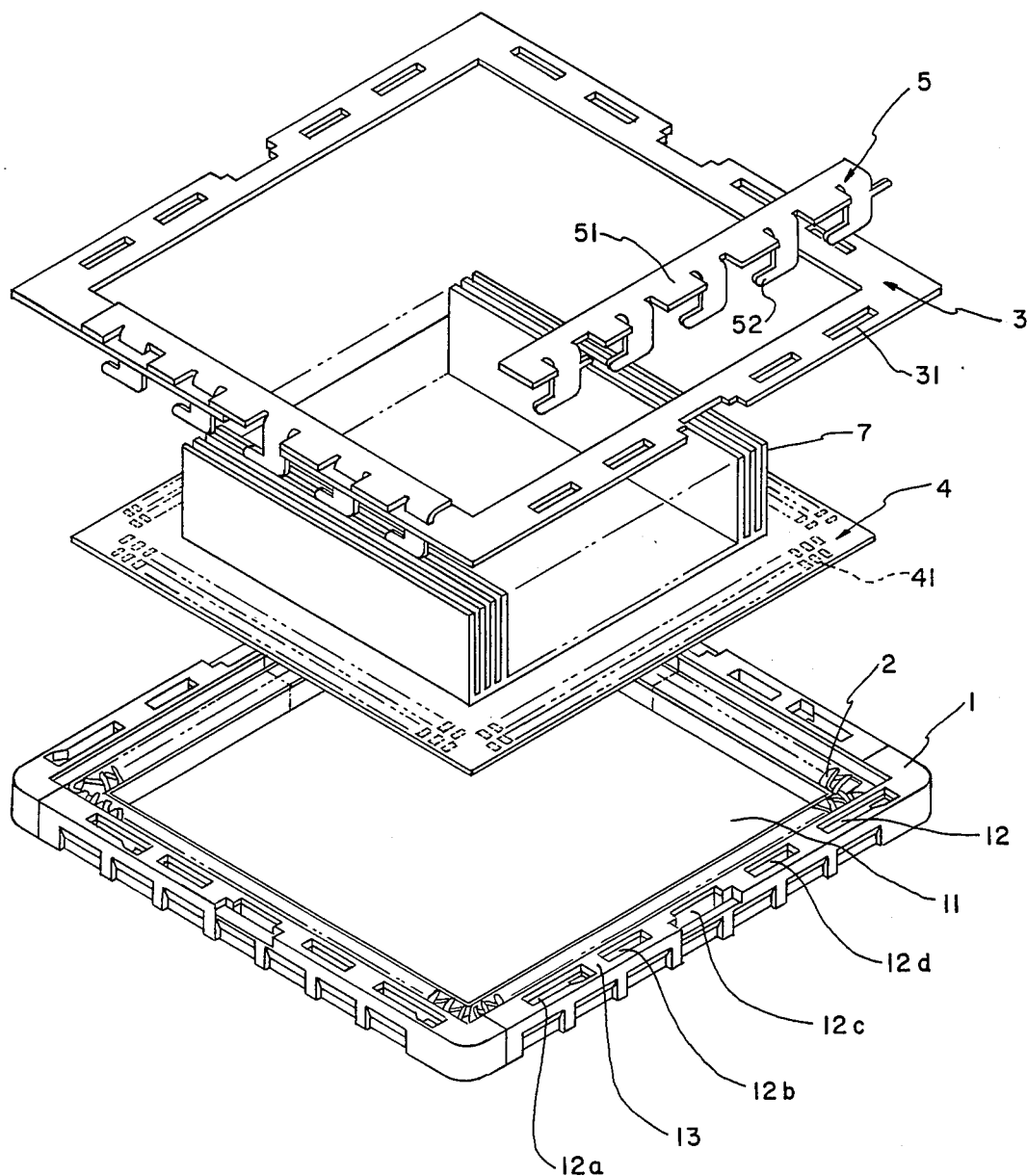
FIG. 2 is a perspective view of the connector disassembled.

Referring to FIGS. 1 and 2, an embodiment shown therein has an arrangement generally similar to that of the connector as disclosed in U.S. patent No. 4,204,722 except construction and layout of contact elements and use of a cover plate. The connector includes a connector housing 1, a plurality of contact elements 2 mounted in connector housing 1, a cover plate or frame 3 for overlying a leadless integrated circuit package or a daughter board 4, and clamping or locking members 5 for depressing and locking cover plate 3 together with daugther board 4 in the depressed condition.

Connector housing 1 is made of insulator material such as polycarbonate, polypropylene, polyphenylene sulfite, polybutylene terephthalate and the like, and is formed in a generally rectangular frame to have a rectangular opening 11 at the center portion for receiving daughter board 4 therein. Contact elements 2 are mounted in a bottom portion of central opening 11 of connector housing 1, as described in detail hereinafter. A slit 12 is formed in connector housing 1 in parallel with the periphery thereof, and is separated by bridge portions 13 so as to form a plurality of openings 12a, 12b, 12c and 12d. The bottom portion of each bridge portion 13 is formed with a notch 14, as shown in FIG. 1, which cooperates with locking member 5. As shown in FIGS. 1 and 2, locking member 5 of, for example, stainless steel is formed with an edge portion 51 and a plurality of hook portions 52 protruding downwardly in L-shaped forms. Cover plate or frame 3, for example, stainless steel is formed with a plurality of openings 31 corresponding to openings 12a, 12b, 12c and 12d of connector housing 1.

Figures 7, 8:
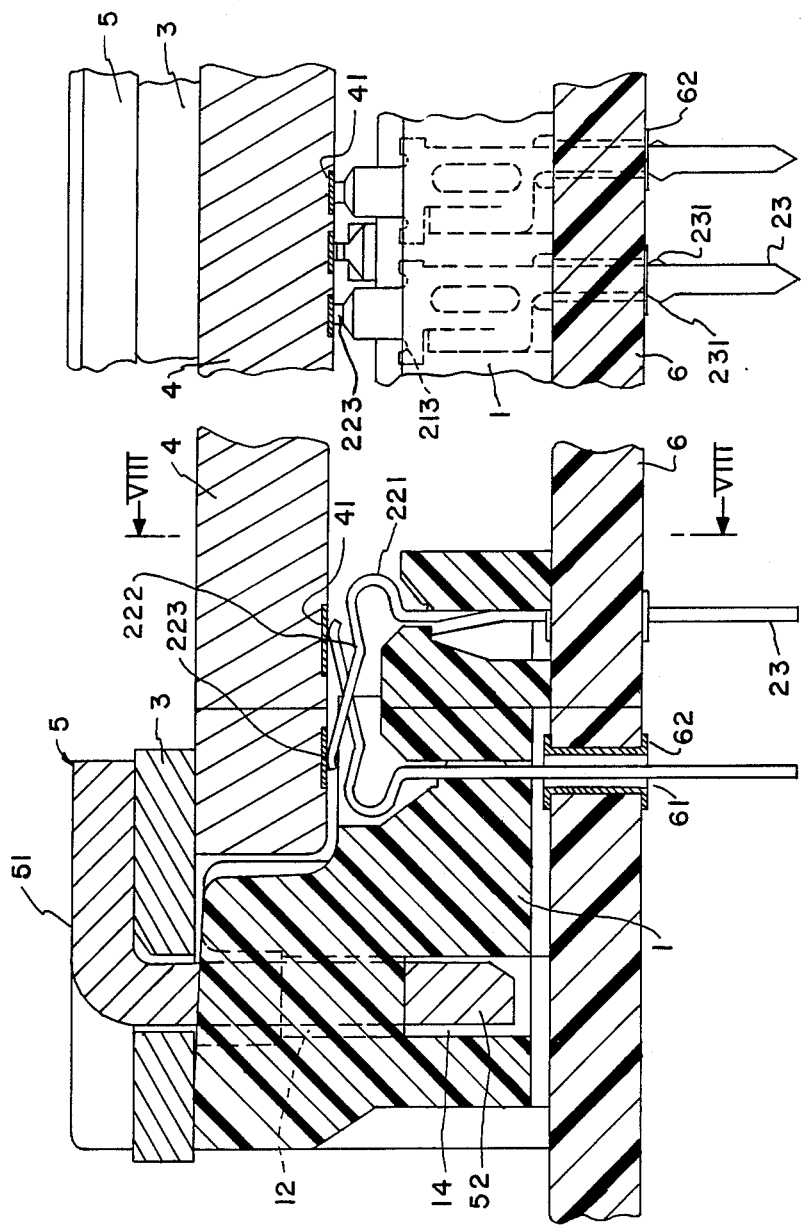
FIG. 7 is a sectional view similar to FIG. 6 but a daughter board mounted in the connector and the connector mounted on a mother board.
FIG. 8 is a sectional view taken along a line VIII—VIII in FIG. 7.

FIG. 7 shows, in cross section, the peripheral portion of insulator housing 1, and the cover plate 3, both of which cooperate to define an opening chamber for receiving the printed circuit board 4. The locking plates 5 (see also FIG. 2), holds together the insulating housing and the cover plate 3. By an inspection of the space between housing 1 and cover plate 3, it will be clearly seen that the top surface of the peripheral portion of the housing 1 descends toward printed circuit board 4 and, therefore, toward the opening chamber.

In the arrangement, daughter board 4 is put into rectangular opening 11 of connector housing 1, and cover plate 3 overlies daughter board 4 with openings 31 being in registry with openings 12a, 12b, 12c and 12d of housing 1. Then, hook portions 52 of locking member 5 are inserted into the registered openings 31 and 12 and locking member 5 is slid longitudinally to establish engagement between hook portions 52 and notch portions 14. Edge portion 51 engages with cover plate 3, so that cover plate 3 and daughter board 4 are depressed and are maintained in the depressed condition. Terminal pads 51 of daughter board 4 are reliably engaged with contact element 2 of the connector. Thus, daughter board 4 is electrically and mechanically mounted in the connector.

The connector is previously mounted on a printed circuit board or a mother board 6, and therefore, daugther board 4 is electrically and mechanically mounted on mother board 6 by mounting it in the connector. The connector is fixedly mounted onto mother board 6 by soldering contact elements 2 to conductor elements of mother board 6, as described hereinafter.

FIGS. 1 and 2, a reference numeral 7 represents a heat sink or a heat radiator which is mounted on daughter baord 4.

Figure 3:
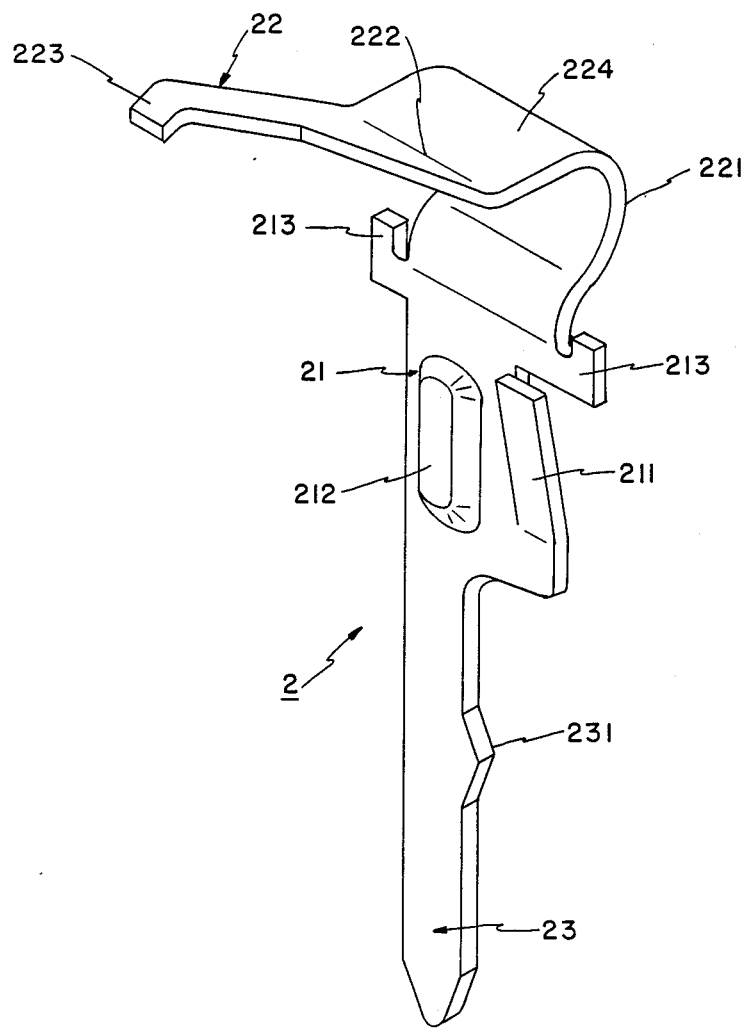
FIG. 3 is a perspective view of a contact element of the connector.
Figure 4:
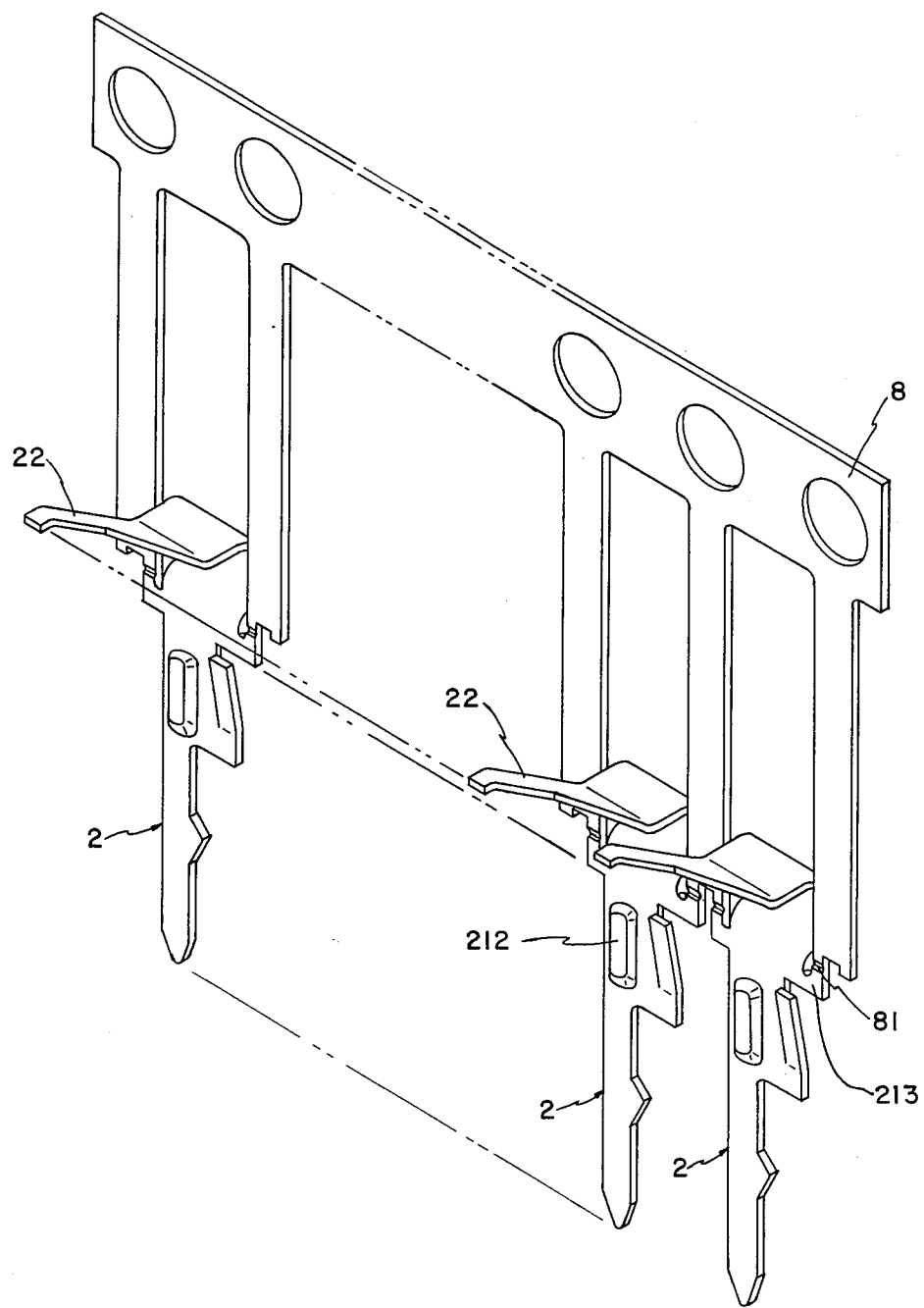
FIG. 4 is a perspective view of a set of contact elements produced from a metal plate.
Figure 6:
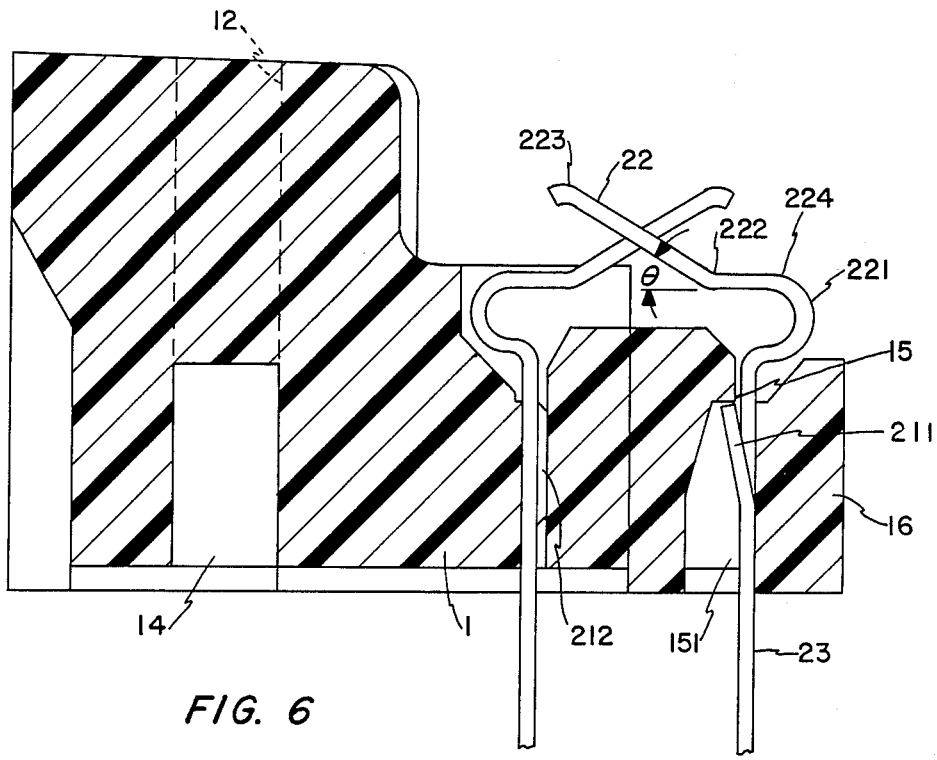
FIG. 6 is a sectional view taken along a line VI—VI in FIG. 5, with contact elements mounted in connector housing.

Referring to FIGS. 3 and 4, contact element 2 is formed of a sheet of metal plate such as phosphor bronze, beryllium copper and the like, to have a central portion 21, a spring contact portion 22 extending upwardly therefrom, and a terminal pin portion 23 extending downwardly thereform. Central portion 21 is provided with a finger poriton 211, and a protrusion 212 press-formed on central portion 21. Central portion 21 is also provided with a pair of fin portions 213 which project laterally from upper opposite ends thereof. Spring contact portion 22 extends upwardly from the upper end of central portion 21 through a first bent portion 221, and a second bent portion 222 with reduction of its width, and a contact region 223 is formed at the top end of the reduced width. Spring contact portion 22 is bent at first bent portion 221 by an angle of substantially 90° to form a horizontal portion 224 perpendicular to the surface of central portion 21, and is bent upwardly at second bent portion 222 by angle of Θ (which is shown in FIG. 6 and is less than 90°). Terminal pin portion 23 is formed to have a width less than that of central portion 21 and extends downwardly from a lower end of central portion 21 at one side thereof. Terminal pin portion 23 is provided with a projection 231 projecting from its one side surface in its width direction.

A plurality of contact elements 2 can be produced from a large metal plate blank 8 by stamping processes, or press-forming processes as shown in FIG. 4.

Figure 5:
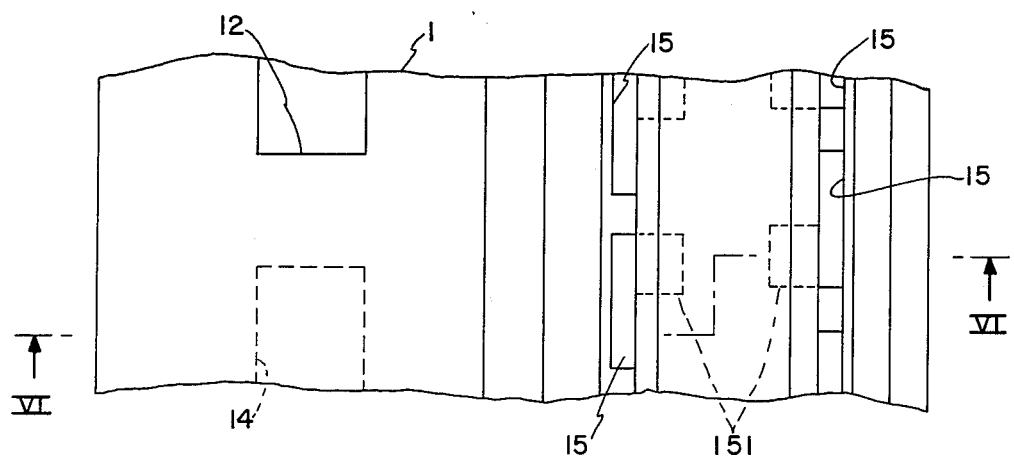
FIG. 5 is a plan view of a portion of a connector housing of the connector.

Referring to FIGS. 5 and 6, contact elements 2 are mounted in connector housing 1 by inserting them into apertures 15 formed in housing 1. Apertures 15 are formed in the bottom portion 16 of opening 11 of housing 1 and are arranged in two rows along the edge of opening 11. Each aperture 15 is formed in a rectangular form having a width slightly smaller than the total dimension of the thickness of the sheet metal of contact element 2 and the height of protrusion 212 and a length slightly larger than the width of the central portion 21 of contact element 2 but smaller than the span between the opposite ends of the pair of fins 213. Aperture 15 is partially enlarged in its width direction at its lower portion to form a chamber 151.

When contact element 2 is inserted into aperture 15 until fins 213 engage with the opening edge of aperture 15, it is interference fitted in aperture 15 due to protrusion 212 and finger 211 is received in chamber 151 after passing the opening edge with resilient deformation. Therefore, contact element 2 is prevented from falling off upwardly from the aperture by engagment of finger 211 with ceiling of chamber 151 in addition to friction of central portion 21 and the inner wall of aperture 15, and from falling off downwardly by engagement of fins 213 with the opening edge of aperture 15.

Removal of contact element 2 from aperture 15 is readily performed by pressing finger 211 by a certain tool such as a screw driver inserted into chamber 151 from the bottom side to disengag finger 211 from the ceiling of chamber 151 and by pulling it upwardly.

Referring in FIG. 7 in addition to FIG. 6, when daughter board 4 is not mounted in the connector, contact region 223 is raised from the bottom surface of opening 11 of connector housing 1, as shown in FIG. 6. When daughter board 4 is mounted in the connector, it is depressed against the resilience of contact elements 2 by sliding locking member 5 as described above. Accordingly, contact region 223 is pushed downwardly, and therefore, spring contact portion 22 is resiliently deformed so that a large spring force generates to press contact region 223 onto terminal pads 41. Thus, sufficient contact pressure is established between terminal pad 41 and contact region 223. Since spring contact portion 22 is bent by about 90° at first bent portion 221 adjacent central portion 21 and is bent upwardly at second bent portion 222, contact region 223 is almost positioned at the highest position of the contact element even if the contact portion is subjected to deformation after long use. Therefore, any portion other than contact region does not engage with the daughter board.

Figure 10:
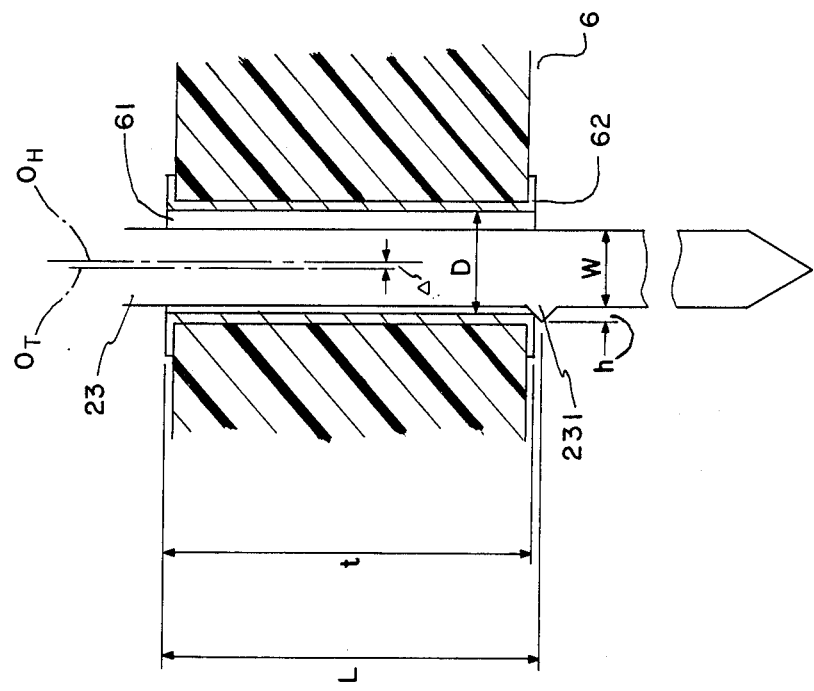
FIG. 10 is a sectional view of a portion of a mother board with a terminal pin portion of the contact element inserted in a through-hole of the mother board.

Referring to FIG. 8 in addition to FIG. 7, mother board is provided with through-holes 61 at conductor elements 62 thereof and the connector is fixedly mounted on mother board 6 by inserting terminal pin portions 23 into through-holes 61 and by soldering them to conductor elements 62 of through-holes 61. Projection 231 of each terminal pin portion 23 engages with lower opening edge of through-hole 61, so that the bottom surface of connector housing 1 is maintained in contact with the upper surface of mother board 6 even before the soldering process is performed. In this connection, projection 231 should be formed at a position of terminal pin portion 23 spaced apart from the bottom surface of connector housing 1 by a distance L nearly equal to, or slightly larger than, the thickness t of mother board 6, as best shown in FIG. 10. As a result, since it is not required that connector housing is pressed manually towards mother board 6 before soldering process, soldering is perfomed either manually or automatically. An automatic soldering process such as an automatic dipping process or a flowing method can be employed.

Figure 9:
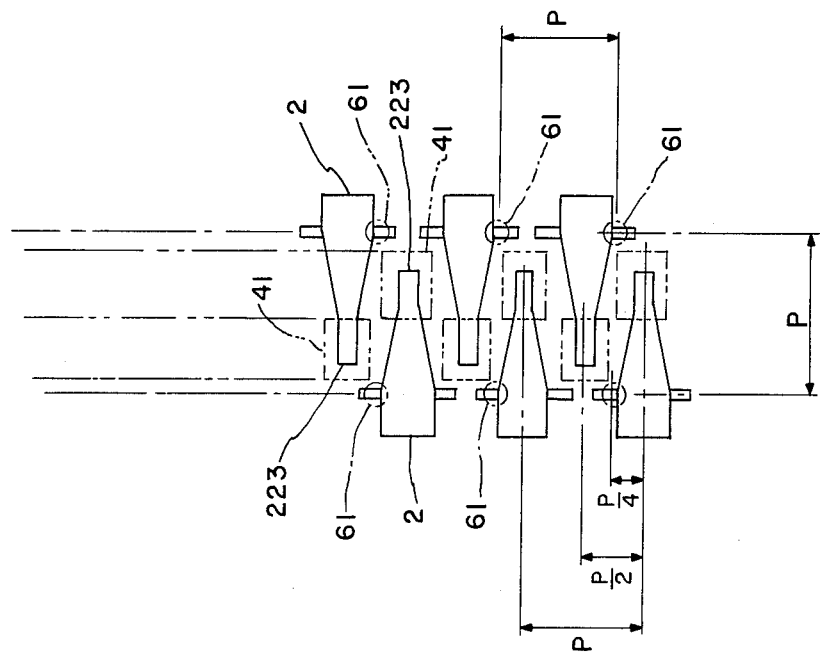
FIG. 9 is a plan view of a portion of the connector.

Referring to FIG. 5 again, apertures 15 in one row are offset from apertures 15 in the other row so that apertures 15 of two rows are arranged in zigzags. Contact elements 2 having the same construction are inserted into apertures 15 in one row with an orientation but are inserted into aperture 15 in the other row with a reversed orientations as shown in FIG. 6. Accordingly, contact regions 223 of contact elements 2 are disposed in zigzags as best shown in FIG. 9. This means that an increased number of contacts 2 may be disposed within a unit area. In response to the zigzag arrangement of contact regions 223, terminal pads 41 of daughter board 4 are disposed in zigzags. As a result, the number of terminal pads formed in unit area is increased.

In order to enable to insert a set of contact elements 2 into apertures 15 at one time, they should advantageously be maintained to be connected to the waste blank 8 at fin portions 213, but grooves 81 are formed in the connecting portions, as shown in FIG. 4. After the set of contact elements 2 are inserted into apertures 15, the waste blank portion is bent along grooves 81 so that the contact elements are separated from the waste blank portion and from one another.

Since contact elements 2 have the same construction and are disposed in apertures 15 in the two rows with the orientations reversed to one another, terminal pin portions 23 are disposed in a matrix having a plurality of rows and two columns so that through-holes 61 are formed in the matrix, as shown by dot-and-dash lines in FIG. 9. In the matrix arrangement of through-holes 61, mother board 6 may be produced readily. Referring to FIG. 9, providing that spaces between adjacent columns and between adjacent rows of the matrix of through-holes 61 are equal to one another and are denoted to be p, spaces between adjacent apertures 15 of each aperture row is also p but apertures 15 of both rows are offset by p/2 from one another.

The matrix arrangement of terminal pin portions 23 and through-holes 61 aids the reliable engagement between projection 231 of each contact element 2 and the lower opening edge of through-hole 61, in addition to the use of contact terminals of the same construction into two apertures with reversed orientations.

Referring to FIG. 8, projections 231 of contact elements 2 in one aperture row project leftwards and projections 231 of contact elements 2 in another aperture row project rightwards. Therefore, even if the diameter of each through-hole 61 is larger than the width of each terminal pin portion 23 enough that the terminal pin having the projection is smoothly inserted in the through-hole, projections 231 of contact elements 2 of either one of the two rows engage with mother board 6 to prevent the connector from separating from the surface of mother board 6. In this connection, providing that the diameter of through-hole 61 is D and that the width of terminal pin portion 23 is W, as shown in FIG. 10, the height h of projection 231 should be selected to be expressed as:

$$D-W>h>(D-W)/2-\Delta,$$

where $\Delta$ represents a distance between the central axis $O_H$ of through-hole 61 and the central axis $O_T$ of terminal pin portion 23. Stated another way, $\Delta$ reresents the offset distance between the axes of the hole and pin.

This invention has been described in detail in connection with a preferred embodiment, but it is example only. It is understood by those skilled in the art to readily make various variations and other designations within the scope of this invention.

What is claimed is:

1. A connector for electronically interconnecting terminal pads on a first printed circuit board with conductor elements on a second printed circuit board, said second board having a plurality of through-holes formed therein, each of said through-holes having a central axis and a diameter D; said connector comprising a housing made of insulating material and defining an upwardly opening central chamber for receiving and supporting said first printed circuit board, said housing having a bottom surface and a plurality of apertures longitudinally arranged in first and second spaced parallel rows along at least one lower edge of said central chamber; a plurality of contact elements received in individually associated ones of said apertures, each of said contact elements having an upper portion, a lower portion, and a central portion bridging said upper and lower portions; each of said central portions being secured in an associated one of said apertures; each of said upper portions having a contact spring portion generally extending from said central portion into said central chamber for making contact with one of the terminal pads on said first printed circuit board; each of said lower portions having a terminal pin portion projecting downwardly from said bottom surface and through one of said through-holes for making contact with said conductor elements on said second printed circuit board, each of said terminal pin portions having a width of W, each of said terminal pin portions extending downwardly from one of said central portions; each of said terminal pin portions having a triangular shaped pennant projecting from said terminal pin portion to define an area between said bottom surface and said pennant which is approximately equal to the thickness of said second printed circuit for receiving and capturing said second printed circuit board, each of said pennants having a projecting height h which is given by:

$$D-W>h>(D-W)/2-\Delta$$

where $\Delta$ is a distance between the central axis of said through-hole hole and the central axis of said terminal pin portion extending through said through-hole when said connector is mounted on said second printed circuit board; a first group of said contact elements being secured in said first row of said apertures with said pennants projecting in a first direction from said first group of contact elements; a second group of said contact elements being secured in said second row of said apertures with said pennants projecting in a second direction which is opposite to said first direction, whereby said connector can be readily mounted on said second printed circuit board by inserting said terminal pin portions into said through-hole, and said pennant of each contact element of either of said first and second groups of contact elements reliably engages the lower opening edge of a corresponding one of said through-holes in said second printed circuit board to capture said second printed circuit board between said bottom surface and said pennants of said either one group when said connector is mounted on said second printed circuit board.

2. A connector as claimed in claim 1, wherein each of said contact elements is die cut from electrically conductive spring material to form said upper, said lower, and said central portions, said lower and said central portions being formed to having generally flat planar surface, said terminal pin portion extending downwardly from said central portion in a form of a flat strip, said pennant projecting laterally from a side end surface of said terminal pin portion.

3. A connector as claimed in claim 2, wherein said central portion has an opposied pair of limiting fin portions for limiting the penetration of said central portion of said contact element into its associated aperture when positioned therein, and a locking finger bent outwardly from said central portion to lockingly fit into a small chamber in an associated one of said apertures at the limit of said penetration into said aperture to prevent upward movement of said contact element in said aperture.

4. A connector as claimed in claim 3, wherein said locking finger is a stamped and raised member extending upwardly to a top end, one of said pair of limiting fins being provided with a lower end formed by stamping said locking finger so that said top end and said lower end are generally on a common level, said lower end of said limiting fin engaging an opening edge of a corresponding one of said apertures, said small chamber having an upper wall generally on a level of said opening edge of the corresponding aperture, said top end of the locking finger engaging saud upper wall.

5. A connector as claimed in claim 2, which further comprises said contact spring portion extending upwardly in a form of a flat strip with a gradually reduced width from the upper end of said central portion through a fist portion which is bent by a first angle and a second portion bent by a second angle that is less than said first angle, and said contact spring portion having a contact region at its top end.

6. A connector as claimed in claim 5, wherein said first angle is about 90° so that the region between said first and second bent portions is generally perpendicular to the surface of said central portion.

7. A connector as claimed in claim 5, which further comprises said terminal pin portion which is offset from said contact region in a direction of the width of said central portion, said apertures in the first row being offset from said apertures in the second row in a direction of each row so that said contact regions of said first and second groups of said contact elements are disposed in a zigzag arrangement, with said terminal pin portions disposed in a matrix and said through-holes of said second printed circuit board being disposed in a matrix.

8. A connector as claimed in claim 3, wherein said central portion has a protrusion partially press-formed to have a height on the surface of said flat portion, each aperture of said insulator housing having a rectangular cross-section with a pair of opposite sides having a length which is slightly smaller than the total dimension of the thickness of said conductive spring material and the height of said protrusion, said central portion having said press-formed protrusion inserted into said aperture and being in press-contact with said pair of opposite side walls, and one of said side walls being locally depressed to form said small chamber for receiving said locking finger.

9. A connector as claimed in claim 1, which further comprises a cover plate to be overlaid onto said first printed circuit board when it is mounted in said central chamber of said insulator housing, and locking means for depressing and locking said cover plate onto said insulator housing together with said first printed circuit board.

10. A connector as claimed in claim 9, wherein said insulator housing has a first peripheral portion defining said central chamber, said cover plate has a second peripheral portion facing a top surface of said first peripheral portion of said insulator housing, said locking means locking said insulator housing and said cover plate to each other at their first and second peripheral portions, and the top surface of said first peripheral portion of said insulator housing descending slightly toward said central chamber, so that an inner region of said cover plate descends by a locking action of said locking means so as to sufficiently depress said first printed circuit board for establishing reliable interconnection of said terminal pads on said first printed circuit board and said spring contact portions.

* * * * *